United States Patent
Chelli et al.

(10) Patent No.: US 7,230,482 B2
(45) Date of Patent: Jun. 12, 2007

(54) METHOD OF PREVENTING ABRUPT VOLTAGE CHANGES AT THE OUTPUTS OF A PAIR OF AMPLIFIERS AND CONTROL CIRCUIT FOR A PAIR OF AMPLIFIERS SELF-CONFIGURING IN A BRIDGE CONFIGURATION

(75) Inventors: Fabio Chelli, Milan (IT); Davide Brambilla, Rho (IT)

(73) Assignee: STMicroelectronics S.r.l., Agrate Brianza (IT)

( * ) Notice: Subject to any disclaimer, the term of this patent is extended or adjusted under 35 U.S.C. 154(b) by 67 days.

(21) Appl. No.: 11/022,020

(22) Filed: Dec. 23, 2004

(65) Prior Publication Data

US 2006/0022749 A1 Feb. 2, 2006

(30) Foreign Application Priority Data

Dec. 23, 2003 (EP) ................... 03425816

(51) Int. Cl.
 *H03F 3/45* (2006.01)
 *H03F 1/14* (2006.01)
 *H03F 3/00* (2006.01)
(52) U.S. Cl. ............................ 330/69; 330/146; 330/51
(58) Field of Classification Search ................ 330/69, 330/251, 207 A, 146, 51
See application file for complete search history.

(56) References Cited

U.S. PATENT DOCUMENTS

| | | | | | |
|---|---|---|---|---|---|
| 5,365,188 | A | * | 11/1994 | Botti et al. | 330/51 |
| 5,444,417 | A | * | 8/1995 | Botti et al. | 330/51 |
| 5,621,352 | A | * | 4/1997 | Botti et al. | 330/51 |
| 5,654,668 | A | | 8/1997 | Botti et al. | 330/51 |
| 6,563,380 | B2 | * | 5/2003 | Huijser | 330/69 |
| 7,053,704 | B2 | * | 5/2006 | Forel et al. | 330/69 |

FOREIGN PATENT DOCUMENTS

| | | |
|---|---|---|
| EP | 0487133 | 5/1992 |
| EP | 0587965 | 3/1994 |

* cited by examiner

*Primary Examiner*—Robert Pascal
*Assistant Examiner*—Krista Flanagan
(74) *Attorney, Agent, or Firm*—Lisa K. Jorgenson; Allen, Dyer, Doppelt, Milbrath & Gilchrist, P.A.

(57) ABSTRACT

A common mode control circuit reduces abrupt voltage changes at the outputs of a pair of amplifiers which, in turn, reduces EMI and distortions that occur when the correlation between the signals fed to the four channels of an audio system diminishes. The common mode control circuit generates for each amplifier a reference potential that is a saturated replica of the respective differential input signal of the amplifier that saturates when the amplifier switches to a bridge configuration.

19 Claims, 4 Drawing Sheets

METHOD OF PREVENTING ABRUPT VOLTAGE CHANGES AT THE OUTPUTS OF A PAIR OF AMPLIFIERS AND CONTROL CIRCUIT FOR A PAIR OF AMPLIFIERS SELF-CONFIGURING IN A BRIDGE CONFIGURATION

FIELD OF THE INVENTION

The present invention relates in general to amplifiers with a reduced power consumption such as for car radio and hi-fi audio applications, and in particular, to a method of preventing abrupt voltage changes at the outputs of a pair of amplifiers, and to a common mode control circuit implementing this method.

BACKGROUND OF THE INVENTION

In many applications and primarily in audio reproduction systems such as car radios, hi-fi audio systems and similar apparatuses that are intrinsically compact because of stringent installation requirements, as well as in portable apparatuses, power dissipation in the final power stages is often quadrupled to drive a pair of loudspeakers (front and rear) for each stereo channel. This may create heat balance problems. For example, four 20 W amplifiers may have a power dissipation of about 4×12=48 W, and because of the limited space available in certain apparatuses, such a relatively large power may be difficult to dissipate without a significant increase of temperature within the apparatus.

Relatively high temperatures of operation may degrade the magnetic tape of cassettes or optical disks (CD), the drives of which are often tightly fitted inside a single apparatus case. D-type switching amplifiers are highly efficient, and are considered the most appropriate type for these applications.

Unfortunately, switching amplifiers generate electromagnetic emissions (EMI) that in compact apparatuses interfere with the correct functioning of other systems, thus reducing their performance. For these reasons, audio signals are frequently amplified using a pair of class AB power amplifiers. The pair of class AB power amplifiers operate in a single-ended mode or in a bridge configuration depending on the level of the processed signal.

In fact, class AB power amplifiers are less efficient than switching amplifiers and a common technique for reducing power consumption of class AB amplifiers includes configuring them in a single-ended configuration instead of in a bridge configuration whenever it is possible to do so. In fact, these amplifiers dissipate more power in the bridge configuration than in the single-ended configuration as long as the level of the output signal remains smaller than the positive supply voltage. Unfortunately, it is not possible to use single-ended class AB amplifiers if the output surpasses this voltage because the output signal would be severely distorted by clipping.

Techniques for automatically switching from one configuration to the other as a function of the monitored level of the signal are disclosed in the following patents: U.S. Pat. Nos. 5,194,821; 5,365,188 and 5,654,688. These patents are incorporated herein by reference in their entirety, and are assigned to the current assignee of the present invention.

U.S. Pat. No. 5,194,821 discloses a bridge amplifier using positive and negative supply voltages that may function in a single-ended or in a differential or bridge output configuration depending on the level of the output signal. A comparator changes the output circuit configuration of the amplifier from a bridge configuration to a single-ended configuration or vice-versa by closing or opening configuring switches when the output signal becomes smaller than or greater than a certain threshold voltage.

U.S. Pat. Nos. 5,365,188 and 5,654,688 disclose a single supply dual bridge power amplifier. As depicted in FIGS. 1 and 2, each amplifier has a window comparator for sensing the level of input signals fed to the amplifier and driving the switches that coordinately configure the amplifier in either a bridge or in a single-ended configuration.

The switching from a single-ended to a bridge output configuration and vice-versa may cause distortions and EMI disturbances in view of the fact that, when functioning with relatively low signal levels, one of the operational amplifiers of the bridge output structure is configured to operate as a buffer. The buffer outputs a constant reference voltage that usually is equal to half the supply voltage when the amplifier is to function as a second operational amplifier for driving the load in a bridge mode configuration following an increase of the signal level. This operational amplifier should rapidly assume a different output voltage, that is, its output voltage undergoes a step variation.

A known approach to reduce this step variation of the output voltage of the operational amplifier that is configured to function as a buffer when switching to a single-ended configuration is disclosed in U.S. Pat. No. 5,654,688, and is based on the use of a common mode control loop employing a sample-and-hold circuit. Although this approach is satisfactory when the signals in the different channels of the amplifier are substantially correlated among each other, the effectiveness in reducing the output step variations upon changing the configuration and the above-mentioned consequences diminishes significantly if the signals in the channels of the amplifier functioning in a bridge mode are no longer correlated.

This phenomenon has become evident in investigating the reasons why in modern car audio systems the distortion would inexplicably increase under certain circumstances. It has been found that increased EMI and increased distortions occur when the correlation between the signals that are fed to the four channels of the audio system diminishes due to different settings of independent channel equalization controls that are customarily provided in quality car audio systems.

The independent equalization setting on the various channels cause different delays of propagation of signals through the channels, which thus become substantially uncorrelated. To better understand the problem to be addressed, reference is made to FIG. 3 that depicts sample diagrams of differential pairs of signals OUT_F+, OUT_F− and OUT_R+, OUT_R− output by the left OPA+F, OPA−F and right OPA+R, OPA−R channels. The signals are referred to a fixed voltage, which is generally half the supply voltage Vcc and are substantially uncorrelated.

When both outputs (OUT_F+)-(OUT_F−) and (OUT_R+)-(OUT_R−) are within the comparison window defined by upper and lower voltage levels $V_{REF+}$ and $V_{REF-}$, respectively, the power switch SW_C is on and the switch SW_F is off. Thus, both channels are single-ended. The opposite happens otherwise, and both channels are bridge configured.

The common mode voltages of the left and right channels, respectively, are sampled when the amplifier switches to the bridge configuration and are held as long as the amplifier switches to a single-ended configuration. When the input signals are substantially uncorrelated, it is very likely that the output signals undergo step variations when the amplifier switches from a bridge to a single-end configuration (instants t2 and t4).

These step variations are potentially dangerous because they may cause even an undue intervention of the protection circuit from short-circuits. In fact, both the amplifier OPA+R that is to switch in the bridge configuration and the amplifier OPA−F that is to be disconnected may output signals with an amplitude far larger than the fixed voltage $V_{CC}/2$. Therefore, when the switch SW_C turns on, the outputs of both channels OPA+R and OPA−F must quickly reach the fixed voltage $V_{CC}/2$, generating a step variation that produces EMI and distortions.

This step variation propagates also to the other channels OPA−R and OPA+F through the feedback lines. Even the power switch SW_C may turn on when it withstands is a high differential voltage, thus generating a cross-conduction current that is likely to cause the intervention of the protection circuit from short-circuits.

A multi-channel power amplifier capable of reducing EMI and distortions is disclosed in European patent application no. 03425357.5 which is assigned to the current assignee of the present invention. Its design ensures that one of the two operational amplifiers of the output bridge structure of each channel be kept at the design reference voltage (typically half of the supply voltage) for as long as the other operational amplifier of the output bridge structure does not begin to saturate. This is done by connecting in common the gate nodes of the P-type MOS transistors and the gate nodes of the N-type MOS transistors of the output half bridge stages of all the operational amplifiers of the output bridge pairs of all the channels that are eventually configured to function as a voltage reference buffer. This is when the multi-channel amplifier is configured to function in a single-ended configuration.

By connecting in common the gate nodes of the output transistor pairs of all the buffer configurable operational amplifiers of the output bridge structures of each channel, they are effectively prevented from delivering differential mode currents to the loads but exclusively common mode currents (that is, currents of equal sign) make them operate as a single buffer.

Of course, the switches that connect in common the gate nodes of the power transistors of the same type are controlled in phase with the switches that configure the multi-channel amplifier to function in a single-ended configuration, referred to a constant reference voltage.

SUMMARY OF THE INVENTION

An object of the invention is to provide a method of preventing abrupt voltage changes at the outputs of a pair of amplifiers, and a common mode control circuit of a pair of amplifiers that address the above mentioned problems that affect multi-channel amplifiers in the presence of uncorrelated audio signals to be amplified.

According to the method of the invention, this result is obtained by properly generating for each amplifier a reference potential as a saturated replica of the respective differential input signal of the amplifier that saturates when the amplifier switches to a bridge configuration.

This method may be implemented in a common mode control circuit for a pair of amplifiers self-configuring in a bridge configuration for driving a first load, and in a single-ended mode of operation of one of the amplifiers for driving the first load as a function of the level of a differential input signal.

The circuit may comprise for at least one of the pair of amplifiers a common mode feedback differential amplifier having a non-inverting input connected to a common mode control node of the pair of amplifiers, and an inverting input that is switched by a configuring switch short-circuiting the inverting input to the non-inverting input. A storage capacitor may be connected between any one of the two inputs and a node at a reference potential. The common mode control circuit may generate this reference potential.

BRIEF DESCRIPTION OF THE DRAWINGS

The various aspects and advantages of the invention will become even more evident through a detailed description referring to the attached drawings, wherein.

DETAILED DESCRIPTION OF THE PREFERRED EMBODIMENTS

Figure 4:
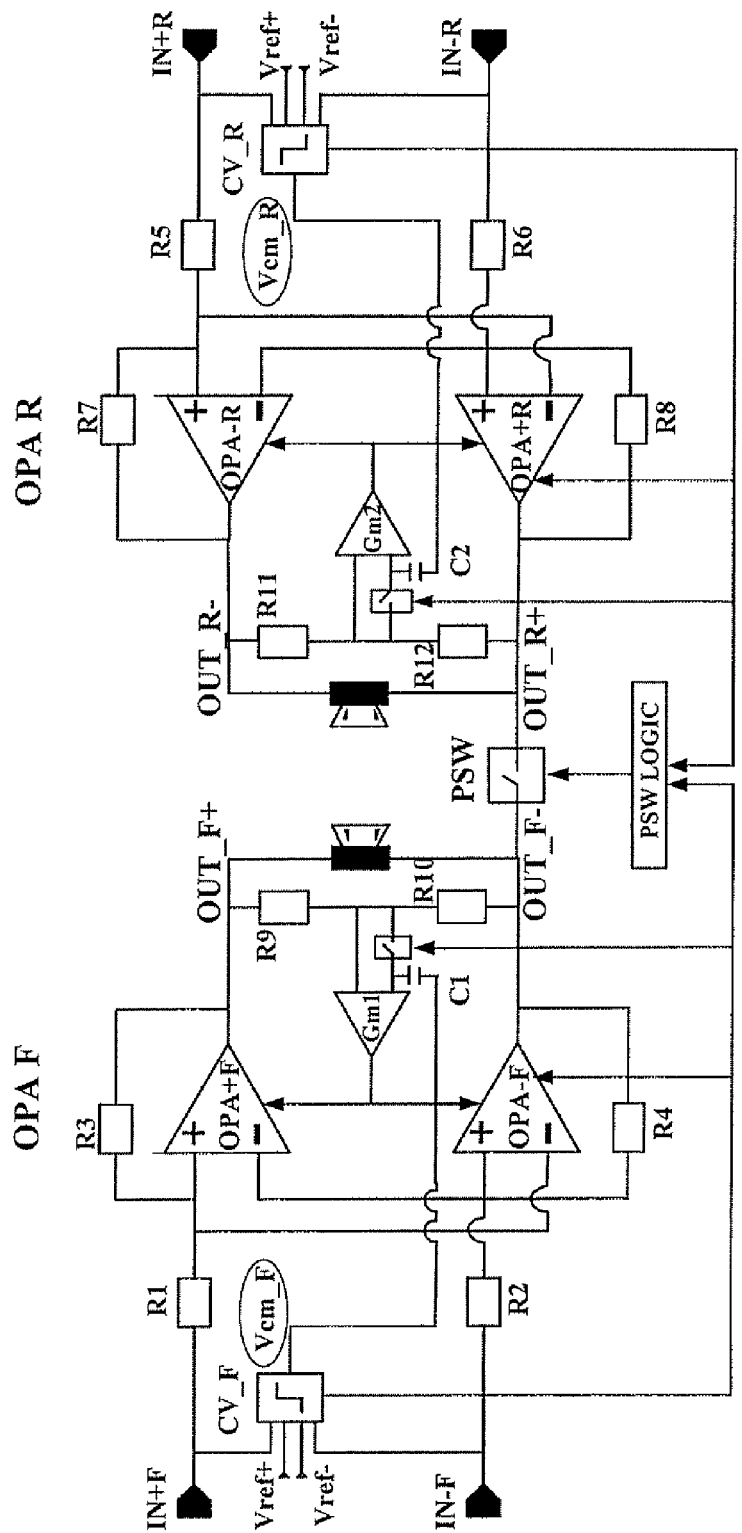
FIG. 4 shows a bridge amplifier including a common mode control circuit in accordance with the invention.

A detailed diagram of a bridge amplifier including a common mode control circuit formed in accordance with the invention is depicted in FIG. 4. R1 ... R12 are resistors and the block PSW_LOGIC contains the logic circuitry that controls the power switch PSW.

Figure 1:
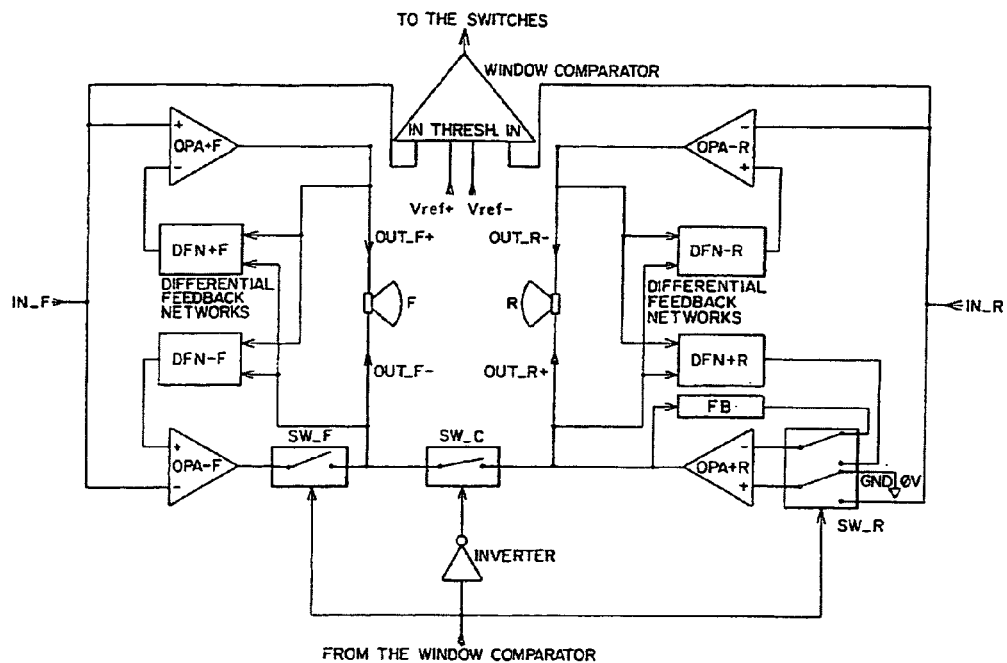
FIG. 1 depicts a prior art amplifier as disclosed in U.S. Pat. No. 5,365,188.
Figure 2:
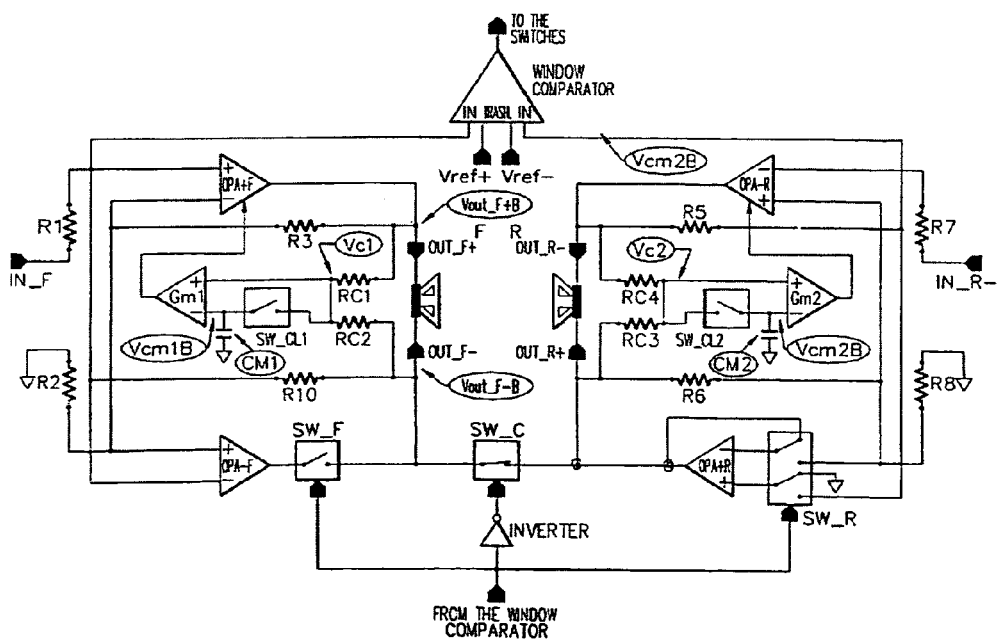
FIG. 2 depicts a prior art amplifier as disclosed in U.S. Pat. No. 5,654,688.
Figure 3:
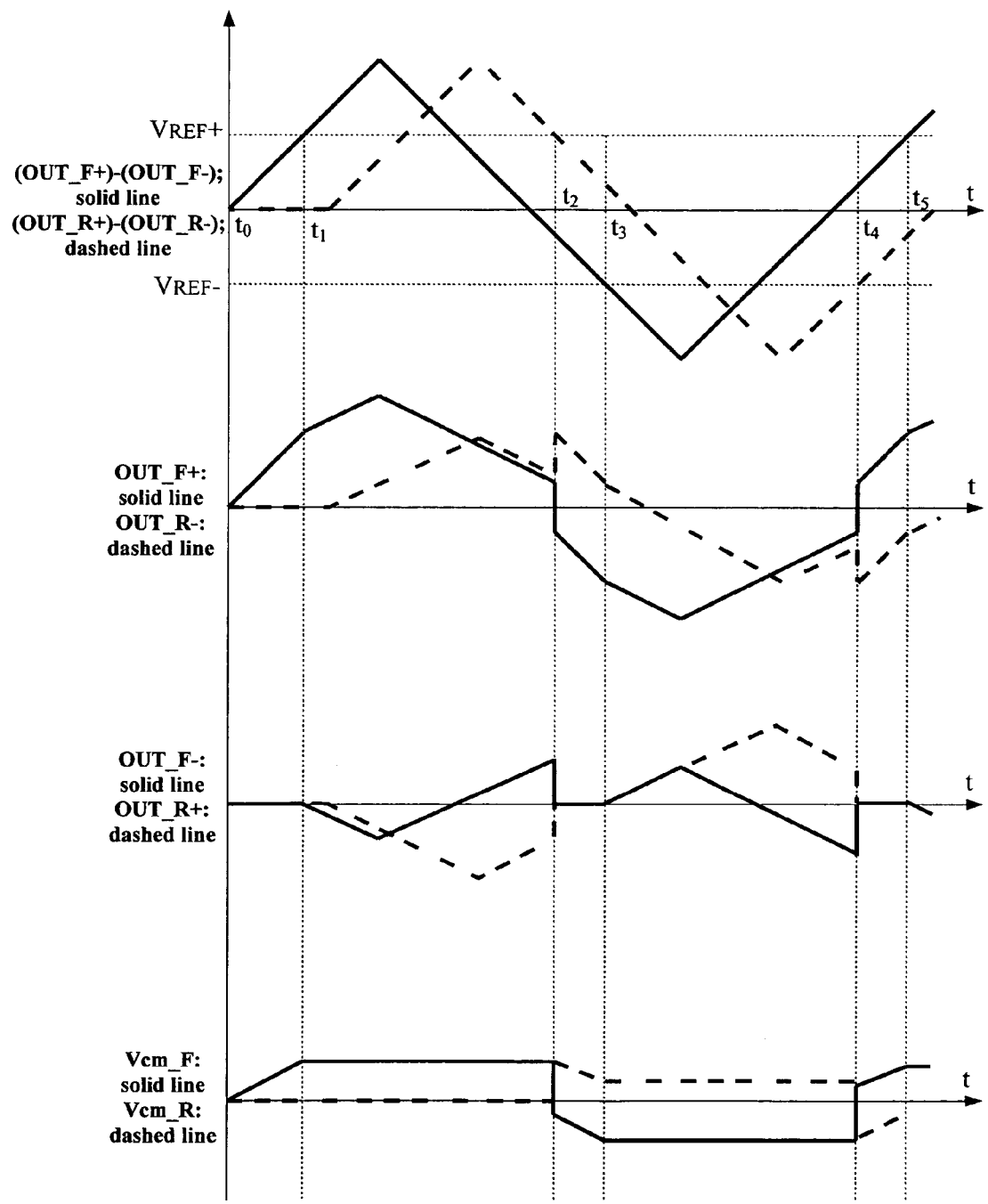
FIG. 3 depicts possible waveforms for the prior art amplifiers of FIGS. 1 and 2 for generating output triangular waveforms.

The general architecture of this bridge amplifier is similar to that of the prior art amplifier of FIG. 2, but the storage capacitors C1 and C2 are not referenced to a ground potential as in the prior art circuit. On the contrary, the storage capacitors C1 and C2 are referenced to voltages $V_{CM\_F}$ and $V_{CM\_R}$, respectively, which are a saturated replica of the respective input signal.

In the example, these voltages $V_{CM\_F}$ and $V_{CM\_R}$ are purposely generated by the differential/single-ended converters CV_F and CV_R, respectively, and range within the same voltage levels $V_{REF+}$ and $V_{REF-}$ that define the comparison window of the input differential signals within which the amplifier is in a single-ended configuration. When an input signal reaches the level $V_{REF+}$ (or $V_{REF-}$) above (or below) which the amplifier is switched in a bridge configuration, the respective reference voltage $V_{CM\_F}$ or $V_{CM\_R}$ saturates.

Figure 5:
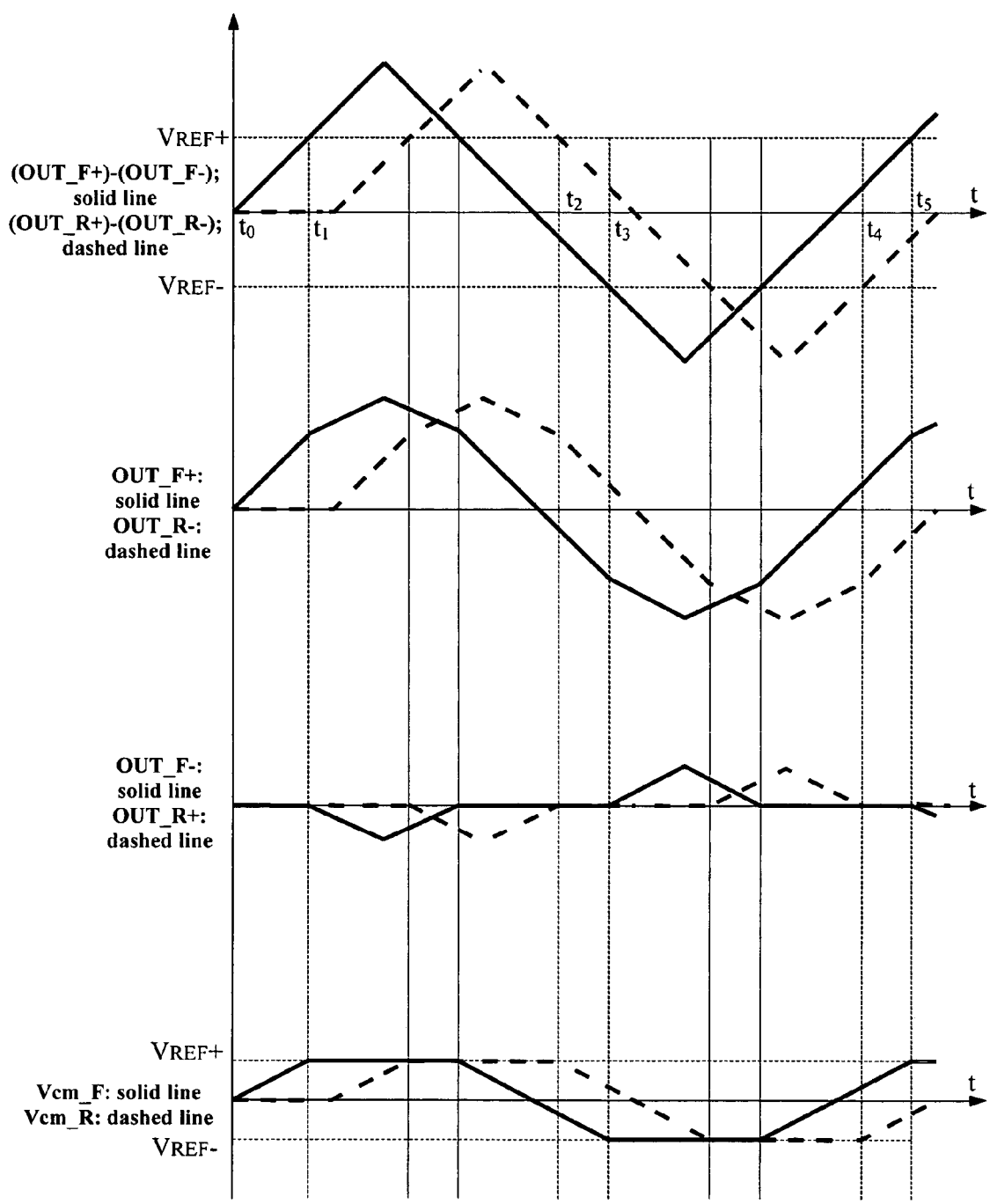
FIG. 5 shows waveforms of the main signals of the bridge amplifier of FIG. 4 for generating output triangular waveforms.

To better understand the functioning of the converters CV_F and CV_R, reference is made to FIG. 5 that illustrates the waveforms of the output signals of the left and right channels. The reference voltages $V_{CM\_F}$ and $V_{CM\_R}$ for the left and right channels, respectively, coincide with the left input differential signal (IN+F, IN−F) and with the right input differential signal (IN+R, IN−R), respectively.

When an input differential signal surpasses the upper or lower level $V_{REF+}$ or $V_{REF-}$, respectively, the respective reference voltage $V_{CM\_F}$ or $V_{CM\_R}$ remains constant and the channels are switched from a single-ended configuration to a bridge configuration. In contrast, when both differential input signals are again within the window of comparison, the power switch PSW is switched on, the voltages $V_{CM\_F}$ or V$_{CM\_R}$ equal the respective input differential signals and the channel is in a single-ended configuration.

The common mode feedback amplifiers Gm1, Gm2 sense the difference between the signals OUT_F+, OUT_R− (suitably scaled by the voltage dividers R9, R10 and R11, R12) and the common mode voltages of the respective channels stored on the sampling capacitors C1, C2.

As long as the common mode voltages of the output signals are half the respective output signals OUT_F+ and OUT_R−, the other signal OUT_F− and OUT_R+ of each differential output is obviously null.

Given that the saturation values of the reference voltages V$_{CM\_F}$ and V$_{CM\_R}$ are the levels V$_{REF+}$, V$_{REF-}$ that define the comparison window for the input differential signal, the common mode voltages of the output signals are half the voltages OUT_F+ and OUT_R− when the amplifier is switched in a single-ended configuration. Thus, the other signals OUT_F− and OUT_R+ are null and there is no step variation of the output signals.

A bridge amplifier including a common mode control circuit of the invention prevents step variations of the output signals when switching from a bridge to a single-ended configuration, ensuring lower distortion and EMI figures than prior art amplifiers. The circuit of the invention is thus particularly suited for forming audio amplifiers for Dolby® surround and home theater systems, which are characterized by substantially uncorrelated input audio signals to be amplified.

That which is claimed is:

1. A common mode control circuit for at least one pair of amplifiers self-configuring in a bridge configuration for driving a first load, and in a single-ended configuration using one of the amplifiers for driving the first load based upon a level of a differential input signal, the common mode control circuit comprising:
    a configuring switch;
    a common mode feedback differential amplifier for the at least one of the pair of amplifiers and having a first input connected to a common mode control node of the at least one pair of amplifiers, and a second input that is switched by said configuring switch for short-circuiting the first and second inputs;
    a storage capacitor connected between a reference potential and one of the first and second inputs of said common mode feedback differential amplifier; and
    a reference potential circuit for generating the reference potential as a saturated replica of the differential input signal for the amplifier that saturates when switching to the bridge configuration.

2. A common mode control circuit according to claim 1, wherein the first input comprises a non-inverting input and the second input comprises an inverting input of said common mode feedback differential amplifier.

3. A common mode control circuit according to claim 1, wherein said reference potential circuit comprises a differential-to-single-ended converter receiving as input the differential input signal and a pair of saturation voltages for generating the reference potential.

4. A common mode control circuit according to claim 2, wherein said storage capacitor is connected to the inverting input of said common mode feedback differential amplifier.

5. A common mode control circuit according to claim 1, wherein the at least one pair of amplifiers comprises first and second pairs of amplifiers, with the first pair of amplifiers being connected to the first load and the second pair of amplifiers being connected to a second load in series with the first load; and wherein the first and second pairs of amplifiers are each being driven by a respective differential input signal based upon levels thereof.

6. A common mode control circuit according to claim 1, wherein the first load comprises a speaker.

7. A bridge amplifier comprising:
    at least one pair of amplifiers having a common mode control node associated therewith; and
    a common mode control circuit for self-configuring said at least one pair of amplifiers in a bridge configuration for driving a first load, and in a single-ended configuration using one of the amplifiers for driving the first load based upon a level of a differential input signal, said common mode control circuit comprising
    a configuring switch,
    a common mode feedback differential amplifier for said at least one of the pair of amplifiers and having a first input connected to the common mode control node of said at least one pair of amplifiers, and a second input that is switched by said configuring switch for short-circuiting the first and second inputs,
    a storage capacitor connected between a reference potential and one of the first and second inputs of said common mode feedback differential amplifier, and
    a reference potential circuit for generating the reference potential as a saturated replica of the differential input signal for said amplifier that saturates when switching to the bridge configuration.

8. A bridge amplifier according to claim 7, wherein the first input comprises a non-inverting input and the second input comprises an inverting input of said common mode feedback differential amplifier.

9. A bridge amplifier according to claim 7, wherein said reference potential circuit comprises a differential-to-single-ended converter receiving as input the differential input signal and a pair of saturation voltages for generating the reference potential.

10. A bridge amplifier according to claim 8, wherein said storage capacitor is connected to the inverting input of said common mode feedback differential amplifier.

11. A bridge amplifier according to claim 7, wherein said at least one pair of amplifiers comprises first and second pairs of amplifiers, with said first pair of amplifiers being connected to the first load and said second pair of amplifiers being connected to a second load in series with the first load; and wherein the first and second pairs of amplifiers are each being driven by a respective differential input signal based upon levels thereof.

12. A bridge amplifier according to claim 7, wherein the first load comprises a speaker.

13. A method for using a common mode control circuit for preventing abrupt voltage changes at outputs of at least one pair of amplifiers self-configuring in a bridge configuration for driving a first load, and in a single-ended configuration using one of the amplifiers for driving the first load based upon a level of a differential input signal, the common mode control circuit comprising a configuring switch;
    a common mode feedback differential amplifier for the at least one of the pair of amplifiers and having a first input connected to a common mode control node of the at least one pair of amplifiers, and a second input that is switched by the configuring switch for short-circuiting the first and second inputs; and a storage capacitor connected between a reference potential and one of the first and second inputs of the common mode feedback differential amplifier, the method comprising:

storing an output common mode voltage of the at least one pair of amplifiers on the storage capacitor during a phase of bridge configuration when the first and second inputs of the common mode feedback differential amplifier are short-circuited by the configuring switch;

keeping constant a voltage on the common mode control node during a phase of single-ended configuration when the short-circuiting switch is closed; and generating the reference potential as a saturated replica of the differential input signal for the amplifier that saturates when switching to the bridge configuration.

14. A method according to claim 13, wherein the first input comprises a non-inverting input and the second input comprises an inverting input of the common mode feedback differential amplifier.

15. A method according to claim 13, wherein keeping constant the voltage is based upon a voltage on the storage capacitor.

16. A method according to claim 13, wherein the reference potential circuit comprises a differential-to-single-ended converter receiving as input the differential input signal and a pair of saturation voltages for generating the reference potential.

17. A method according to claim 13, wherein the storage capacitor is connected to the inverting input of the common mode feedback differential amplifier.

18. A method according to claim 13, wherein the at least one pair of amplifiers comprises first and second pairs of amplifiers, with the first pair of amplifiers being connected to the first load and the second pair of amplifiers being connected to a second load in series with the first load; and wherein the first and second pairs of amplifiers are each being driven by a respective differential input signal based upon levels thereof.

19. A method according to claim 13, wherein the first load comprises a speaker.

* * * * *